(12) United States Patent
Wald et al.

(10) Patent No.: US 6,493,262 B1
(45) Date of Patent: Dec. 10, 2002

(54) METHOD FOR OPERATING NONVOLATILE MEMORY CELLS

(75) Inventors: Keith R. Wald, Los Altos, CA (US); Chan-Sui Pang, Sunnyvale, CA (US); Yueh Yale Ma, Los Altos Hills, CA (US)

(73) Assignee: Winbond Electronics Corporation (TW)

( * ) Notice: Subject to any disclaimer, the term of this patent is extended or adjusted under 35 U.S.C. 154(b) by 176 days.

(21) Appl. No.: 09/587,085

(22) Filed: May 31, 2000

Related U.S. Application Data (62) Division of application No. 09/083,628, filed on May 22, 1998, now abandoned.

(51) Int. Cl.[7] ............................................. G11C 16/04
(52) U.S. Cl. ........................... 365/185.15; 365/185.29; 365/185.33; 365/185.18; 365/185.26
(58) Field of Search ....................... 365/185.29, 185.33, 365/185.15, 185.18, 185.26

(56) References Cited

U.S. PATENT DOCUMENTS

| | | | |
|---|---|---|---|
| 5,077,691 A | 12/1991 | Haddad et al. | 365/185.23 |
| 5,235,544 A | 8/1993 | Caywood | 365/185.26 |
| 5,640,123 A * | 6/1997 | Akaogi et al. | 327/534 |
| 5,691,939 A | 11/1997 | Chang et al. | 365/185.18 |
| 5,706,228 A * | 1/1998 | Chang et al. | 365/185.18 |
| 5,742,541 A * | 4/1998 | Tanigami et al. | 365/185.3 |
| 5,862,082 A | 1/1999 | Dejenfelt et al. | 365/185.33 |
| 5,898,633 A | 4/1999 | Caravella et al. | 365/226 |
| 5,946,240 A * | 8/1999 | Hisamune | 365/185.28 |
| 5,953,611 A | 9/1999 | Tanaka | 438/267 |

* cited by examiner

Primary Examiner—Andrew Q. Tran
(74) Attorney, Agent, or Firm—Townsend and Townsend and Crew LLP (57) ABSTRACT

The present invention is directed at a new nonvolatile memory cell structure, and a new erase method and apparatus for operating this and other nonvolatile memory cells, with special emphasis on source-side injection flash EEPROM cells, which enhances the erase efficiency of the cell. By activating the select-gate terminal of the cell using a negative voltage, it has been found for the first time that the erase performance can be improved. In one preferred embodiment, the present invention provides for three overlapping voltage signals applied to the cell terminals, of which two are negative and one positive. In another preferred embodiment, the memory cell is built on an "internal P-well" within an isolating N-well on the P-type substrate. In this case, by shifting the memory cell's body potential, the erase-mode uses four overlapping erase signals, two of which are negative, and two positive. With experimental data, it is demonstrated that better "magnitude balance" has been achieved for the highest erase voltages of opposite polarities. Since only moderate voltages are needed for the erase operation while maintaining the erase speed, the otherwise stringent requirement on transistor breakdown voltages for on-chip charge pumps and driver circuitry can be relaxed.

5 Claims, 7 Drawing Sheets

METHOD FOR OPERATING NONVOLATILE MEMORY CELLS

CROSS-REFERENCE TO RELATED APPLICATIONS

This application is a divisional application of U.S. Ser. No. 09/083,628, filed May 22, 1998, now abandoned, which is incorporated herein by reference for all purposes.

BACKGROUND OF THE INVENTION

1. Field of the Invention

The present invention relates to non-volatile semiconductor memory devices and methods for operating such devices; and more particularly the present invention addresses the method and conditions of erasing nonvolatile memory cells, with special emphasis on triple-polysilicon source-side injection flash EEPROM (electrically erasable and programmable read-only-memory) cells.

2. Description of Related Art

A flash memory cell relies on a floating-gate to store electrical charges. The amount and the polarity of these charges affect the ability of the underlying channel to conduct electrical current. Flash memory cells as known today are constructed either in the form of a four-terminal device (with drain, control-gate, source, and substrate), which is typically made using a double-polysilicon process; or in the form of a five-terminal device (with drain, control-gate, select-gate, source, and substrate), which is typically made using a triple-polysilicon process. In either form, the floating-gate is situated between the control-gate and the substrate.

Figure 1A:
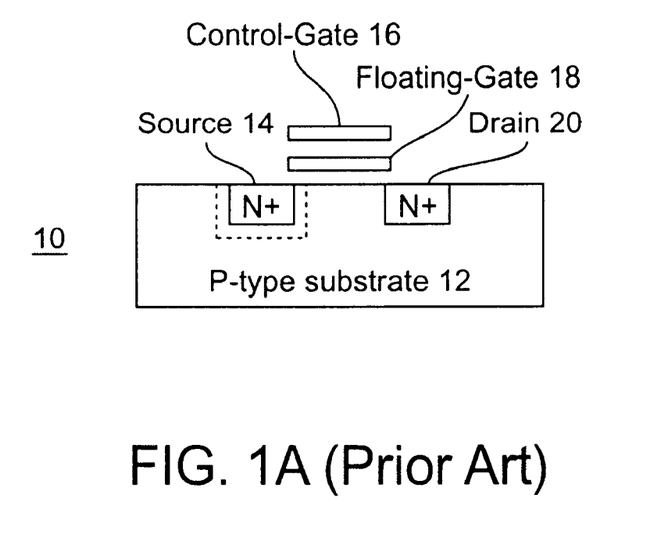
FIG. 1A is a cross-sectional view of a typical four-terminal, drain-side injection cell.
Figure 1B:
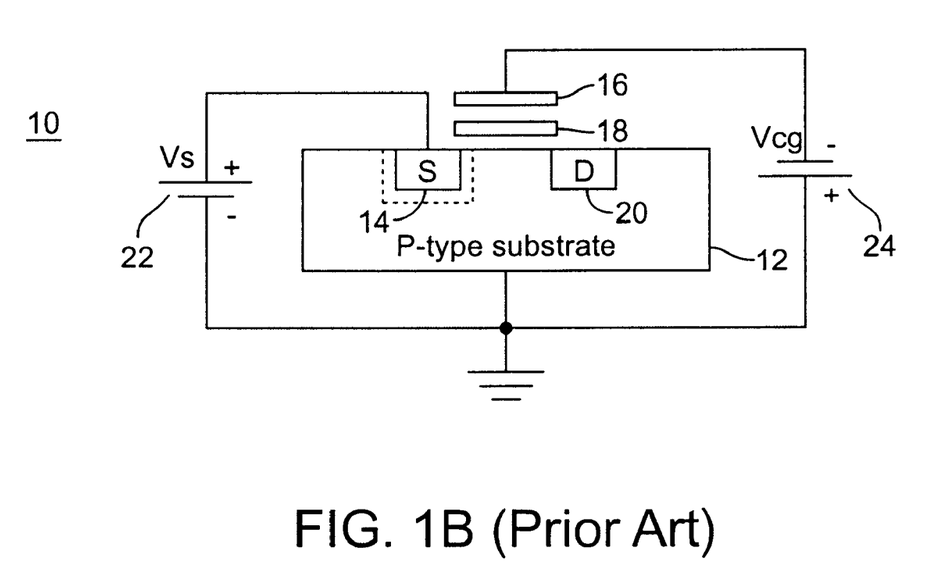
FIG. 1B is the erase-mode biasing condition of the memory cell in FIG. 1A.

FIG. 1A is a cross-sectional view of a typical four-terminal, drain-side injection cell 10. The cell 10 includes a P-type substrate 12, N+ source 14, control-gate 16, floating-gate 18, and N+ drain 20. The erase action in this cell takes place at source region 14, which may be a singly or doubly diffused junction as indicated. FIG. 1B is the erase-mode biasing condition of the memory cell 10, which involves two erase signals, namely, the positive source voltage (Vs) 22 and the negative control-gate (Vcg) 24.

Figure 2A:
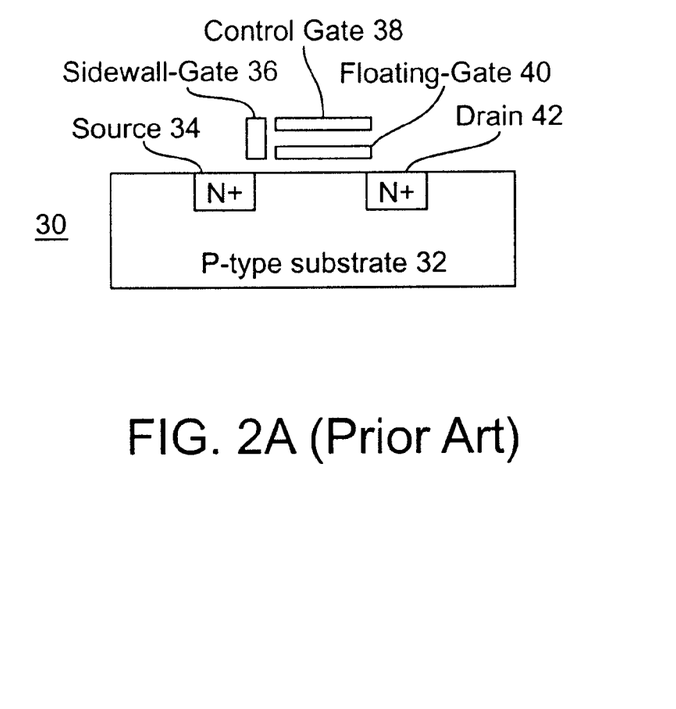
FIG. 2A is a cross-sectional view of a five-terminal flash memory cell known in the prior art.
Figure 2B:
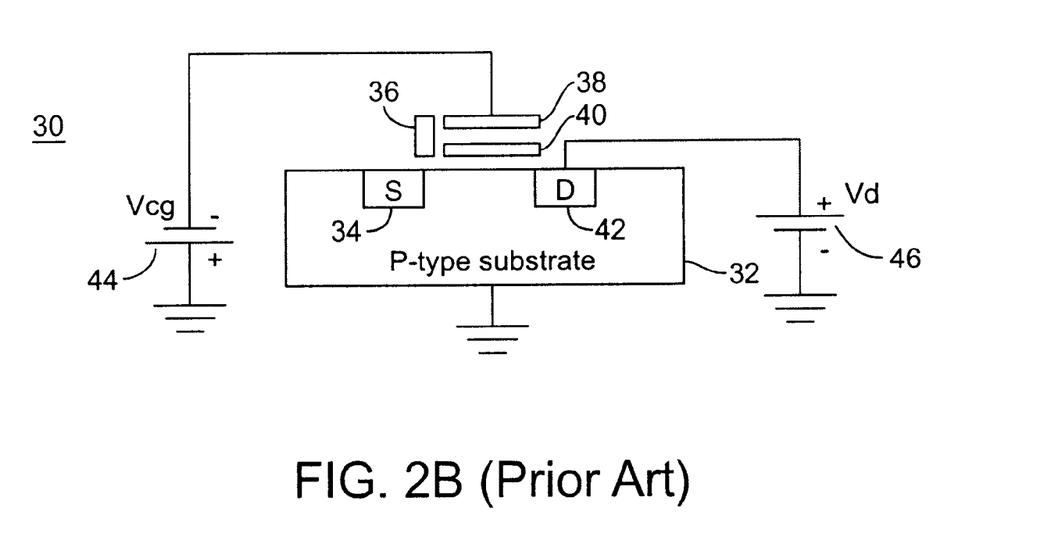
FIG. 2B is the erase-mode biasing condition of the cell in FIG. 2A.

FIG. 2A is a cross-sectional view of a five-terminal flash memory cell 30. Cell 30 includes P-type substrate 32, N+ source 34, sidewall gate 36, control-gate 38, floating-gate 40, and N+ drain 42. FIG. 2B is the erase-mode biasing condition of the cell 30, which also involves two erase signals, namely, the negative control-gate voltage (Vcg) 44 and positive drain voltage (Vd) 46.

Figure 3A:
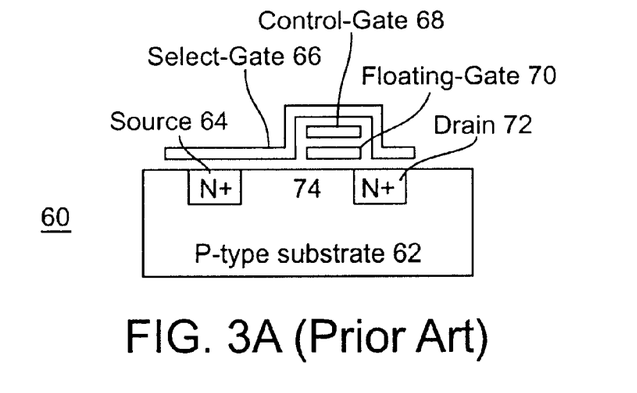
FIG. 3A is a cross-sectional view of a five-terminal, source-side injection memory cell known in the prior art.

FIG. 3A shows a typical source-side injection cell 60 which includes a P-type silicon substrate 62, a pair of heavily doped N-type source and drain regions 64, 72, and three polysilicon (poly) layers surrounded by insulating dielectric. The first polysilicon layer comprises the floating-gate 70, on which charge is stored, while the second polysilicon layer comprises the control-gate 68. As is characteristic of all source-side injection cells, the cell also incorporates a select-gate 66 which is made of a third poly layer which overlaps or extends over the source 64, a portion of the channel region 74, control-gate 68, and drain 72. In the operation of such memory cell 60, the source 64, drain 72, control-gate 68, and select-gate 66 are each connected to voltage supplies, while the substrate terminal 62 is tied to ground. The cell channel 74, defined on the substrate surface 62 between the source and drain terminals 64, 72, is split into two serial sections, with one section connecting to the drain 72 and lying under the floating-gate 70, and the other section connecting to the source 64 and lying under the select-gate 66. With an applied drain-to-source voltage, the channel current is controlled by the voltages at: (1) the floating-gate 70, and (2) the select-gate 66. To conduct current, the voltages at the floating-gate 70 and the select-gate 66 need to be positive; to shut off current requires only a voltage at or below the ground potential appear on either the floating-gate 70 or the select-gate 66.

Figure 3B:
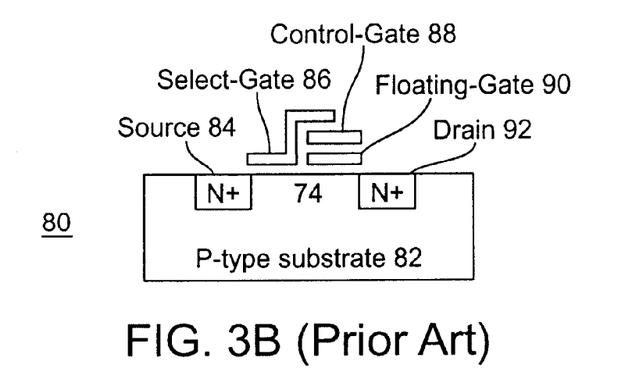
FIG. 3B is a cross-sectional view of another five-terminal, source-side injection memory cell known in prior art.
Figure 3C:
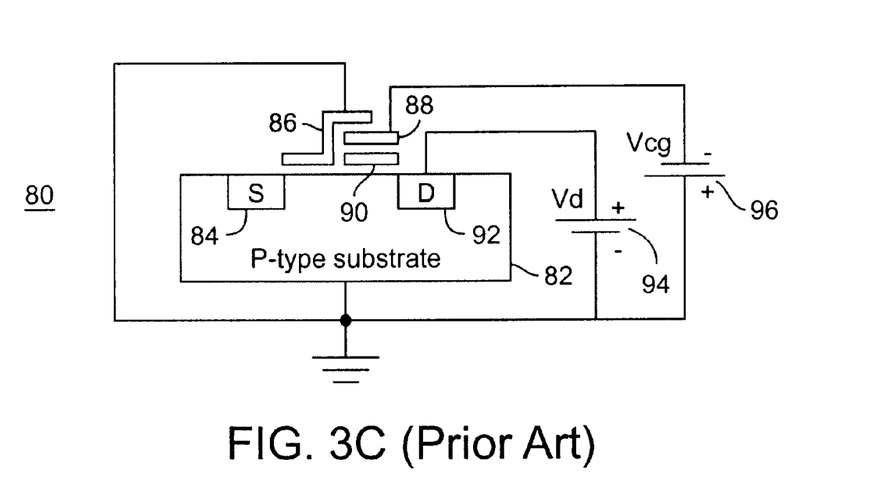
FIG. 3C is the erase-mode biasing condition of the cell in FIG. 3B.

FIG. 3B is a cross-sectional view of another five-terminal cell 80. The cell 80 includes a P-type substrate 82, N+ source 84, select-gate 86, control-gate 88, floating-gate 90, and N+ drain 92. The select-gate 86 extends over a portion of the channel region 74, and only partially overlaps or extends over control-gate 88, whereas select-gate 66 of FIG. 3A completely overlaps source 64, control-gate 68 and drain 72. The source-side injection cell 80 of FIG. 3B is functionally equivalent to that of FIG. 3A. FIG. 3C is the erase-mode biasing condition of the cell 80. Of the two involved erase signals, the positive voltage (Vd) 94 is on the drain 92 and the negative voltage (Vcg) 96 is on the control-gate 88. Note that exact same erase condition can be applied to the cell 60 of FIG. 3A.

Source-side injection cells as set forth by Y. Ma et al., for triple-polysilicon flash memory arrays (U.S. Pat. Nos. 5,280, 446 and 5,278,439) have two basic advantages over the conventional four-terminal (a.k.a. "drain-side injection") cells: (1) in write-mode, source-side injection cells provide superior programming efficiency in terms of reduction of the required channel current, and (2) in erase-mode, the requisite split-gate eliminates the so-called "over erase" condition, thus avoiding a problematic issue which the non-split-gate cell must confront. Based on triple-polysilicon technology, the patent of Fukumoto (U.S. Pat. No. 5,394,360) describes various implementations of the source-side injection memory cell.

Applications of flash memory cells involve three basic operation modes: write, erase, and read. To write a cell means to inject negative charges onto the floating-gate. To erase a cell means to remove the negative charges from the floating-gate, or to displace the negative charges with positive charges. To read a cell means to detect the state of the floating-gate's stored charges by sensing the current flowing through the drain-to-source channel located underneath the floating-gate, thereby resulting in binary logic states or in multi-level logic states.

Fowler-Nordheim tunneling is the dominant erase mechanism for transporting electrical charges from the floating-gate to the substrate. The patent of Haddad et al. (U.S. Pat. No. 5,077,691) teaches a method using a very large negative control-gate voltage (e.g., −12 V to −17 V) combined with a low positive source voltage (e.g., +0.5 V to +5.0 V) for erasing a four-terminal cell. During erase, the charge transfer occurs at the overlapped capacitor between the floating-gate and the source junction. The patent of Caywood (U.S. Pat. No. 5,235,544) teaches: a method using similar conditions (e.g., Vcg=−11 V and Vd=+5 V) for erasing a five-terminal cell, however the select-gate terminal is inactive or left floating. The charge transfer in this case occurs at the overlapped capacitor between the floating-gate and the drain junction. Common to both cases, there are two signals involved in the cell erase: one is negative, one positive; and the substrate (the body-terminal) is kept at ground potential. The relatively low positive erase signal is taken directly, without charge pumping, from the "standard 5 V power-supply voltage." The negative erase signal for the control-gate, however, requires intensive charge pumping in order to support a strong electric field for the electrons to tunnel. As addressed below, the resulting "magnitude disparity" between the required negative and positive voltages is not a favorable condition for advanced technologies. More specifically, the magnitude disparity results in voltage stresses concentrated on one of the cell dielectrics.

Advanced memory chips, containing higher memory density and smaller transistors, demand that the power-supply voltage be reduced below the "old 5 V standard" levels. Indeed, modern power-supplies are re-standardized to such voltages as 3.3 V, 2.5 V, or 1.8 V. For the low power-supply voltage cases, voltage pumping is now required for both positive as well as negative polarities in order to satisfy the erase conditions. In this case, the magnitude disparity between the negative and positive voltages becomes very undesirable for three reasons: (1) voltage pumping from a low level (e.g., 3.3 V) supply-voltage is more difficult than from the "old 5 V standard" power supply; (2) the voltage pumping is now likely limited by the breakdown voltages of the available on-chip transistors, especially when transistors become smaller; and (3) because the memory cell size becomes smaller, the associated array decoders must also be small in order to fit into the cell-pitch, which makes high voltage decoding operation difficult or unworkable.

As will be described below, for the five-terminal "source-side injection" memory cells, the present invention provides an enhanced erase method that can improve the erase efficiency of the cell. Furthermore, by building the memory cells in an "internal P-well" within an isolating N-well on the substrate, experimental data shows, during erase operation, the various required voltages for the device terminals can achieve a better magnitude balance while maintaining the fast erase speed. This leads to advantages in product reliability and in fabrication margins.

SUMMARY OF THE INVENTION

It is an object of the present invention to provide a new nonvolatile memory cell structure and a method and apparatus for operating this and other nonvolatile memory cells, with special emphasis on source-side injection flash memory cells.

While the superior programmability of the five terminal source-side injection cells has been demonstrated in various patented prior art and published technical literature, the present invention plumbs the depth of such five-terminal cell structures in the erase-mode operation. As will be described below with experimental data, by activating the select-gate terminal of the cell using a negative voltage, it has been found for the first time that the erase performance can be improved. The improvements include: (1) the cell's erase efficiency in terms of erasing speed or erasing voltages reduction; and (2) the cell's reliability in terms of reduction of the voltage stress existing between the select-gate and the control-gate. Although the mechanism responsible for such enhancement is not obvious, the fact that these effects are stable and reproducible for three generations of processing technologies (which include 0.35 $\mu$m, 0.5 $\mu$m, and 0.6 $\mu$m lithography available at the present) suggests the present invention is universal for all triple polysilicon source-side injection cells.

It is possible to take further advantage of the five-terminal cell structure by implementing the source-side injection cell in a body region which is electrically isolated from the semiconductor substrate such that the body region is capable of being independently biased. In one embodiment, the cell is implemented in an "internal P-well" located in a deep N-well on the original P-type substrate. In doing this, favorable erase operation conditions can be achieved if the "internal P-well" is biased at a small positive voltage. For advanced processing technologies of fine line lithography, favorable erase operating conditions are defined as those able to achieve a good "magnitude balance" between the negative and positive voltages for the control-gate and drain terminals in the memory cell. Such favorable conditions allow both the N-channel and P-channel transistors to perform at their modest breakdown levels without requiring different gate-oxide thicknesses or deep diode junctions.

Other objects, features, and advantages of the present invention will become apparent from the following detailed description when taken in conjunction with the accompanying drawings.

BRIEF DESCRIPTION OF THE DRAWINGS

The accompanying drawings, which are incorporated in and form part of this specification, illustrate embodiments of the invention and, together with the description, serve to explain the principles of the invention.

DESCRIPTION OF PREFERRED EMBODIMENTS

The present invention will be first described within the context of a generic five-terminal flash memory cell. As will become clear in the following description, this invention is applicable to all five-terminal source-side injection memory cell structures, including examples as those shown in FIGS. 2 and 3. A new memory cell structure having an isolatable cell body terminal will be described, as well as the operation advantages of this cell as compared to the conventional cell structure. This particular feature of the invention is applicable to both four-terminal and five-terminal flash memory cells, as will be explained below. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

A five terminal source-side injection cell is said to be "selected" when the source-side channel section under the select-gate is turned on, while applying a voltage across the drain and source terminals. In this case the channel current is dictated by the charge stored on the floating-gate as well as the voltage applied to the control-gate. For engineering convenience, in order to sense the status of floating-gate's stored charges, we define the cell threshold voltage (Vt) as the required control-gate voltage at which the channel just begins to conduct a 1 uA current. We further define the written state as one of relatively high Vt, in which there is an excess of negative charge (electrons) stored on the floating-gate; and the erased state as one of low or negative Vt, in which the negative charge on the floating-gate is depleted or displaced by positive charge. Vt(W) and Vt(E) denote the cell thresholds in the written and erased states, respectively; with Vt(W)>Vt(E), binary logic can be created.

It is also possible to create multi-level logic by implementing multiple cell thresholds, by either write mode or erase mode, or combinations of both. For simplicity, however, we shall confine our description to binary logic applications. Such applications are sufficient to clearly explain the principles involved. It will be understood, however, that the techniques of the present invention apply equally well to multi-level memory applications.

Complementary to using the cell threshold (Vt) to sense the status of the floating-gate's charge, we can just as effectively use the cell current, measured at a fixed control-gate voltage, as is common practice. To read the state of the cell in this way, in a typical case, 3.3 V or 5 V is applied to the select-gate, a moderate voltage smaller than Vt(W), 4 V for example, is applied to the control-gate, and about 1 V or 2 V is applied to the source, while the drain and substrate are grounded. For binary memory applications, the two logic levels of the memory cell, "0" and "1", are defined as the low current (written) state, and high current (erased) state, respectively. Note that in the read-mode, depending on the applications, the channel current can be directed to flow either from the source toward drain, or from drain toward source.

A source-side injection cell is typically written by applying a large positive voltage, (around 10 V for example) to the control-gate, a moderate voltage (around 5 V for example) to the drain, with the select-gate set to around 2 V. The source and substrate are both held at ground potential. With this bias configuration, hot electrons are generated in the cell's conduction channel near the source side of the floating-gate, in a region between the two serial channel sections mentioned. Some of these hot electrons are deflected by the vertical electric field set up by the control-gate voltage, and are injected into the floating-gate. With an excess of electrons thereby stored in the floating-gate, Vt is moved toward a high value and the cell is in the "written" state. During the read-mode operation, if a cell in written state is selected, the channel current is cut off and a logic state of "0" is signified in that bit.

Conventionally, using two overlapping erase signals, the cell is erased by applying a large negative voltage (around −1 V for example) to the control-gate, and around 5 V to the drain, while the source is floating, and the select-gate and substrate are grounded. FIG. 3C shows one such erase method used in the prior art. The large potential developed between the floating-gate and the drain induces so-called Fowler-Nordheim tunneling of electrons from the floating-gate to the drain. With the floating-gate's stored electrons removed, or displaced by some positive charges, the "erased" state is characterized by a low Vt. During the read-mode, if a cell in this state is selected the cell current is high (relative to the written state), a logic state of "1" is signified.

Figure 4A:
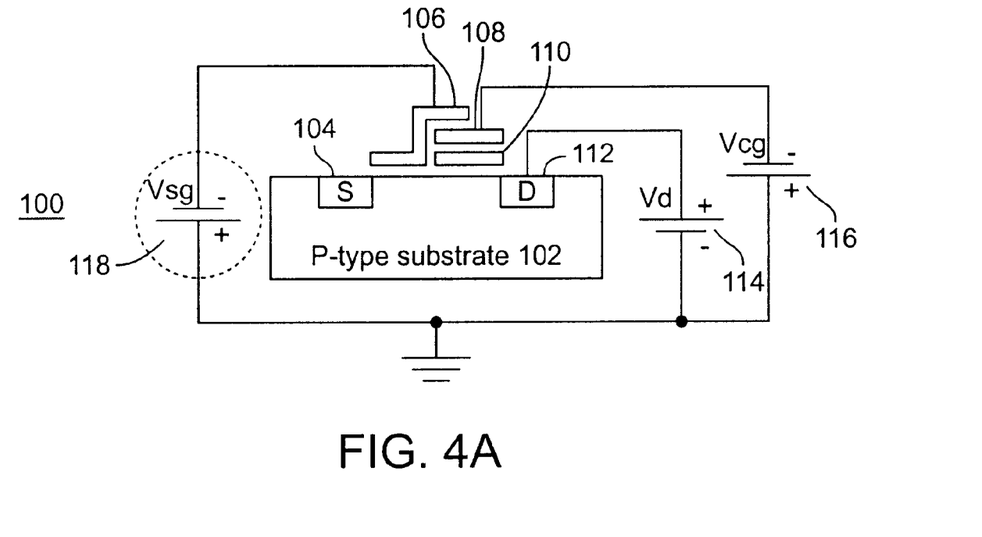
FIG. 4A shows the application of three erase signals to the cell in FIG. 3B in accordance with the present invention.
Figure 4B:
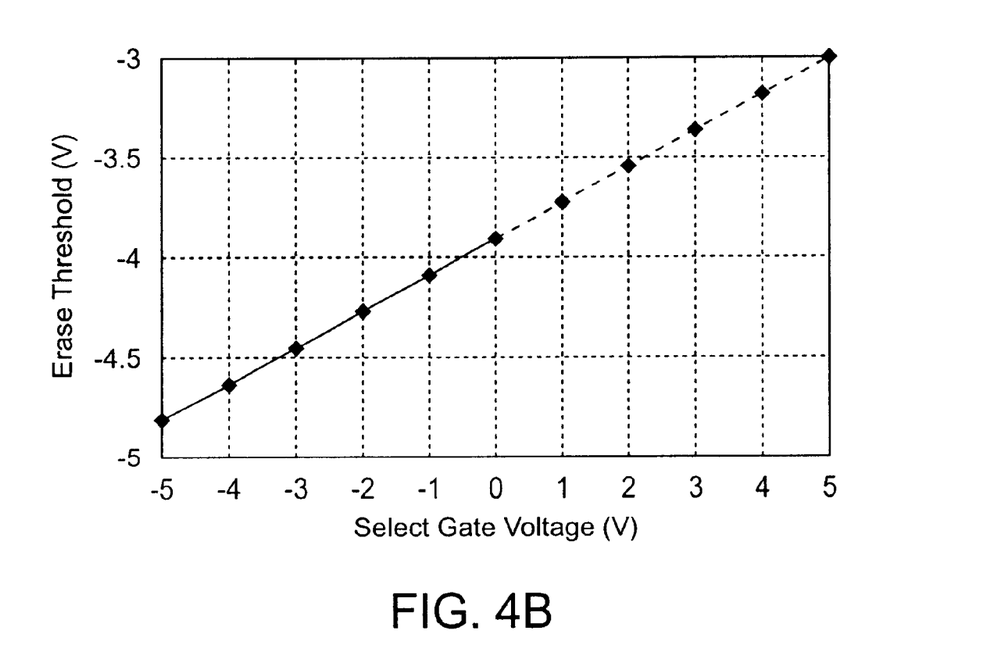
FIG. 4B shows experimental data gathered from the condition displayed in FIG. 4A.

Using three erase signals, FIG. 4A shows an example of the first embodiment of the present invention as it is applied to a generic five-terminal source-side injection memory cell 100. The cell 100 includes a P-type substrate 102, N+source 104, select-gate 106, control-gate 108, floating-gate 110, and N+ drain 112. In marked contrast to the prior art's inactive select-gate condition, the select-gate terminal 106 is activated by a negative voltage (Vsg) 118 during the erase operation (a positive voltage (Vd) 114 is applied to drain 112 and a negative voltage (Vcg) 116 is applied to control-gate 108 during erasure). While applying the high control-gate voltage (about −10 V) and the moderate drain voltage (about +5 V), similar to those applied to cell 80 in FIG. 3C, the activated select-gate 106 in FIG. 4A is biased with a negative voltage of about 0 V to −5 V. As an example, the effect of the select-gate bias on the erase characteristics of the cell 100 is shown in FIG. 4B, where the erased cell's threshold Vt(E) is plotted as a function of the select-gate voltage used during the erase operation. The data in FIG. 4B were gathered under the conditions of control-gate voltage of −10 V, the drain voltage of 5 V, with the source floating and the body grounded.

For an erase time of 500 msec, these data show that the erased threshold varies linearly with the select-gate voltage. With the select-gate biased negatively, enhanced erase performance is achieved. For example, with the select-gate at −5 V, the cell erases to a threshold of about −4.8 V. Compared to the conventional case of a grounded select-gate, where the cell's erased threshold is about −3.9 V, there is about 1 V gain in the erase performance. This erase-mode enhancement effect of the select-gate's negative bias is robust, and has been verified on several different processing technologies and various cell sizes.

In addition to the gain in erased threshold depth, the negative select-gate bias helps improve the reliability of the memory cell. Using the aforementioned examples of erase conditions, consider the electrical stresses on the cell dielectrics resulting from the bias conditions in FIG. 4A in comparison to those of FIG. 3C. In the case of FIG. 3C, the stress voltage across the dielectric between the select-gate and the control-gate is about 10 V, the full magnitude of the control-gate voltage. In the case of FIG. 4A however, the select-gate to control-gate voltage stress can be reduced to as little as 5 V, half that of the conventional case. The voltage stresses on the cell dielectrics have effectively been "shared" between two different dielectrics of the cell instead of one, thus eliminating the single "hot spot" that exists in the case of the prior art. From the memory array reliability standpoint, especially for high density arrays, this reduction of voltage stress on the inter-gate dielectric is very significant in that it will result in fewer charge retention and dielectric breakdown-related cell failures.

Figure 5A:
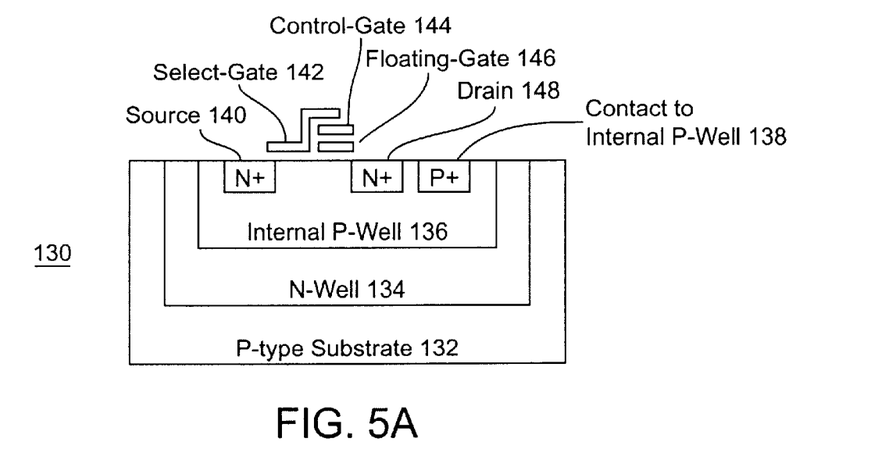
FIG. 5A shows a cross-sectional view of a five-terminal memory cell fabricated in an "internal P-well", which is isolated from the substrate by a partitioning deep N-well.
Figure 5B:
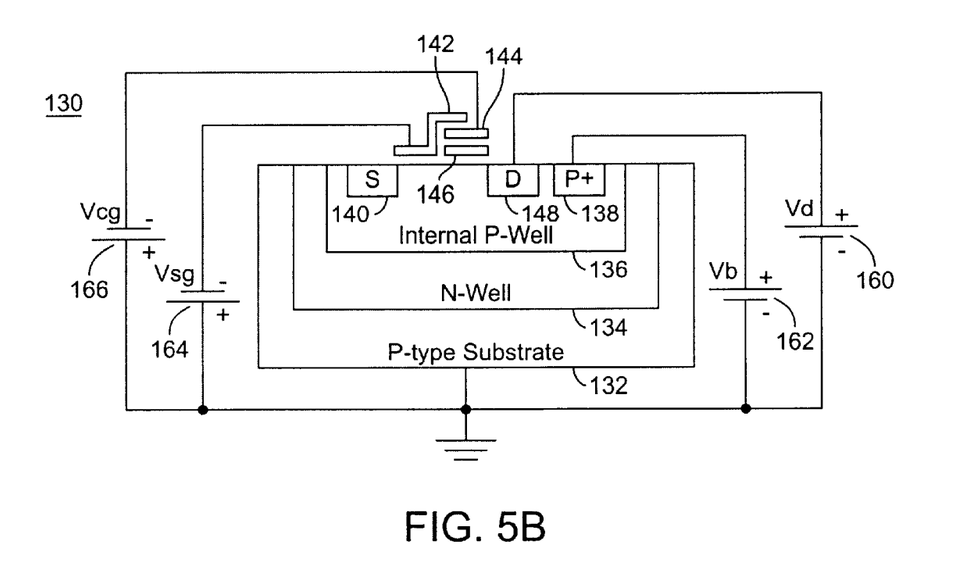
FIG. 5B shows the erase-mode biasing condition of the memory cell in FIG. 5A.

The utility of the select-gate bias effect is more fully realized, and additional benefits are gained, by fabricating the memory cell 130 inside an "internal P-well", as shown in FIG. 5A. On top of the P-type substrate 132, an N-well 134 is formed. In turn, on top of the N-well 134, an internal P-well 136 is formed which forms the body of the memory cell 130. Contact to the internal P-well 136 is made through a P+ diffusion 138. The remaining components of cell 130 include source 140, select-gate 142, control-gate 144, floating-gate 146, and drain 148. This triple-well structure electrically isolates the body of the memory cell 130 from the common substrate 132, allowing the memory cell's body (the internal P-well 136) to become an active terminal. FIG. 5B shows the bias configuration for erasing the cell 130 of FIG. 5A, which includes the positive drain voltage (Vd) 160, positive body voltage (Vb) 162, negative select-gate voltage (Vsg) 164, and negative control-gate voltage (Vcg) 166. With this embodiment, unlike the case of the prior art, the body of the cell 130 can be biased independently of the grounded common substrate 132.

Figure 6:
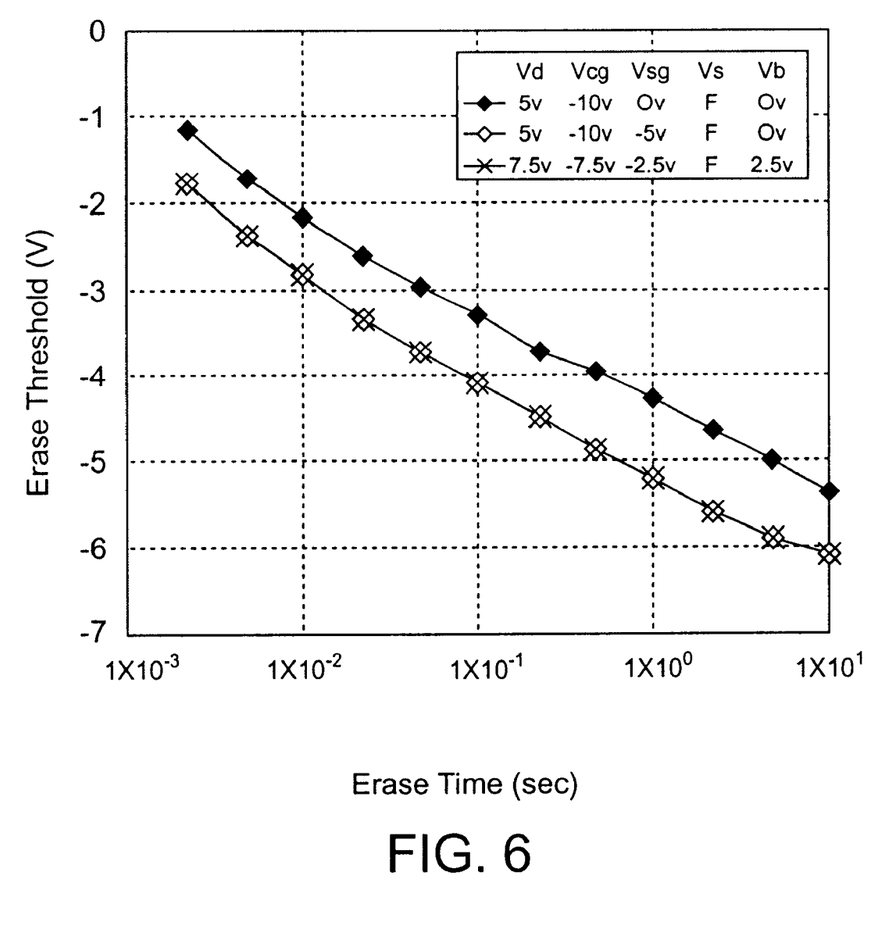
FIG. 6 shows experimental data collected from the condition shown in FIG. 5B.

To illustrate the operational advantages of this cell structure in erase-mode, three example sets of experimental data collected using the memory cell 130 of FIG. 5 are compared in FIG. 6. In FIG. 6, the erase threshold is plotted as a function of erase time for each of the bias conditions listed in the figure. The set of solid symbols corresponds to conventional conditions like those cited for FIG. 3C, with an inactive or grounded select-gate. The set of open symbols shows the effect of biasing the select-gate at −5 V. As in the experiment described above for the setup of FIGS. 4A and 4B, the data here also show that the erased threshold achieved with the new select-gate bias is improved, lying about 1V deeper than the curve obtained using a conventional grounded select-gate.

The set of cross symbols in FIG. 6 corresponds to the erase conditions indicated in FIG. 5B, with −2.5 V on the select-gate, and +2.5 V on the cell's body (i.e., the internal P-well 136). The control-gate voltage is set to −7.5 V, and the drain voltage is at +7.5 V, while the source is floating and the common substrate is grounded. These conditions were chosen to produce exactly the same erase performance as that of the set of open symbols, and in fact are easily seen to be entirely equivalent. Inspection of the legend in FIG. 6 shows that the latter conditions are derived from the former by adding a constant offset of +2.5 V to each of the bias values. The drain voltage, for example, is increased from 5 V in the former case, to 7.5 V in the latter, while the control-gate is increased from −10 V to −7.5 V, and so forth. Because the cell terminal voltages are referenced to the chip's common ground or substrate 132, which is electrically isolated from the cell's body 136 by an N-well 134, only the relative voltage difference of the cell's terminals is meaningful from the point of view of the memory cell alone. Although adding a constant offset voltage changes none of the cell physics, as the data clearly show, the benefit of this voltage displacement is significant in terms of the charge pumping operation as will be explained below.

For chips with single supply-voltage, the elevated voltages used in the internal circuitry are acquired through charge pumping. The highest pumped voltage levels achievable are limited by the breakdown voltages of the transistors in the peripheral circuitry. As discussed in the background section above, any disparity in magnitude between the positive and negative pumped voltage levels places disparate demands on gate-oxide as well as junction breakdown voltages of the N-channel and P-channel transistors, respectively, and is therefore disadvantageous. However, by adding a offset bias to the memory cell body, it becomes possible to bring into balance the magnitudes of the positive and negative voltages required from the on-chip charge pumps during erase. In the example of FIG. 6, for the biased cell body case, the required negative and positive charge pump voltages have been exactly balanced, both equal in magnitude to 7.5 V. The data in FIG. 6 (cross symbols) show that this balancing is achieved without sacrificing erase performance.

Figure 7:
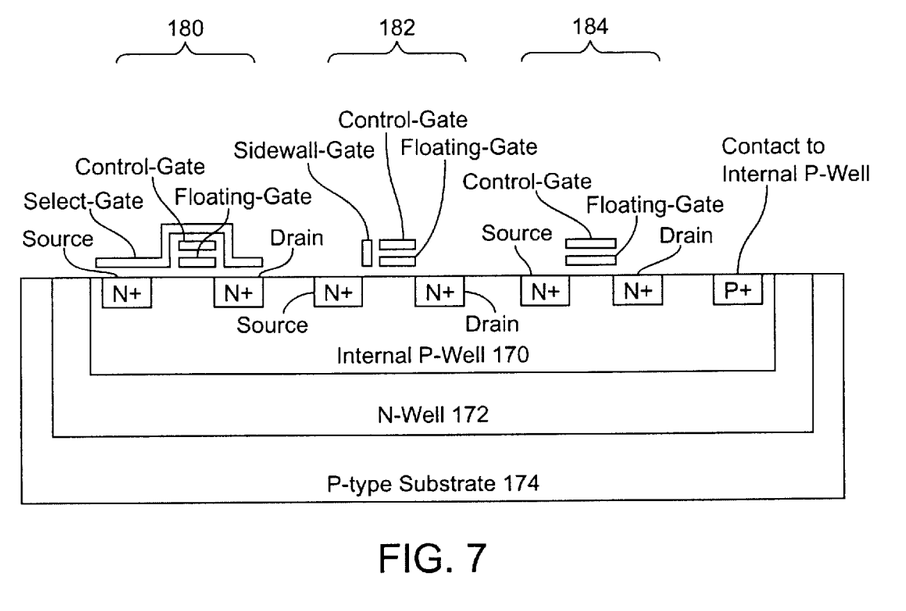
FIG. 7 shows a cross-sectional view of the "internal P-well" body-isolating structure of the present invention applied to the three kinds of floating gate cells.

Noting the similarity between the basic cell structures of FIG. 5A and FIG. 3B, it is clear that the same isolated body triple-well structure can be adapted to the cells of FIGS. 3A, 2A and 1A. This is shown schematically in FIG. 7, where an internal P-well 170 in an N-well 172 on a P-type substrate 174 contains two five-terminal cells 180 and 182, and a four-terminal cell 184.

For comparison, using four equivalent operating voltage conditions, Table-1 summarizes the aforementioned erase configurations of the two-signal, three-signal, and four-signal cases for erasing a source-side injection memory cell of isolated body type (FIG. 5B). Essentially, column A represents the method used in prior art, and columns B and C represent the first and second embodiments of the present invention. Column D will be discussed below. Each of the conditions erases the cell to the same Vt(E) of −4.8 V in a fixed time of 0.5 sec.

TABLE 1

Erase Conditions on Cell Structure of FIG. 5B.
(All values are in Volt; "F" denotes floating.)

|  |  | A | B | C | D |
| --- | --- | --- | --- | --- | --- |
| Drain | Vd | 5 | 5 | 7.5 | 7.5 |
| Control-Gate | Vcg | −11 | −10 | −7.5 | −8 |
| Select-Gate | Vsg | 0 | −5 | −2.5 | 0 |
| Source | Vs | F | F | F | F |
| Body | Vb | 0 | 0 | 2.5 | 2.5 |
| Substrate | Vsub | 0 | 0 | 0 | 0 |
| Resulting | Vt (E) | −4.8 | −4.8 | −4.8 | −4.8 |

In column A, we list the conditions required to achieve this Vt(E) for a cell as operated in accordance with the conventional erase method, with the select-gate and body grounded. In column B, we show conditions of the present invention applied to an established cell structure, with the negative select-gate voltage and body grounded. The required control-gate voltage magnitude has been reduced by 1 V (i.e., from −11 V to −10 V) because of the enhanced efficiency provided by the select-gate bias. Also, as discussed above, the maximum stress voltage on the cell dielectric between the select-gate and control-gate has been drastically reduced. In column C, we have activated the body terminal, which allows the addition of a constant offset of 2.5 V to each of the cell terminals. Maintaining the same erase threshold of Vt(E)=−4.8 V, this configuration achieves good balance of magnitudes for the highest positive and negative erase voltages. Compared to the case of using a conventional cell structure (column B), here the highest erase signal is only 7.5 V for both Vd and Vcg. From the supporting circuitry and peripheral transistors' breakdown voltages requirement standpoint, such reduction in the maximum driver voltage from 10 V to 7.5 V is very substantial in terms of fabrication margins, manufacturing yields, and the product's operating life.

Column D gives an example of an alternative implementation of the present invention, applicable to all prior art cells discussed above, including those of the four-terminal kind (FIG. 1A). In this example, the select-gate is grounded (or absent for the case of a four-terminal cell), while the triple-well structure still provides significant advantage by allowing the body to be biased independent of the substrate ground. Compared to the prior art condition as listed in column A, although not as favorable as the column C condition, the case of column D allows the reduction of the peak voltage from 11 V down to 8 V. Thus the present invention provides a mechanism for improved magnitude balance of operating erase voltages even in cases where the select-gate is unbiased or unused. For example, in the case of four-terminal cells, the erase operation can be performed between the floating-gate and the source, with the drain left floating.

In summary, the present invention is seen to provide substantial advantages in the erase-mode operation of source-side injection memory cells. At the memory cell level, the negative select-gate bias improves the erase performance, reduces the unnecessary voltage stress on the dielectric between the gate electrodes, and enhances the reliability of the memory cell. When combined with the triple-well technology, the new memory cell structure provides additional advantages with regard to the peripheral supporting circuitry and process requirements by allowing the required on-chip voltages to be reduced. The advantage of the triple-well technology is shown to extend to the cases of grounded and absent select-gate configurations.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for erasing a nonvolatile memory cell which includes a source region and a drain region in a semiconductor substrate with a channel region therebetween; a floating-gate over but insulated from a first portion of said channel region; a control-gate over but insulated from said floating-gate; and a select-gate over but insulated from said control-gate, said select-gate also extending over but being insulated from the remaining portion of said channel region, said method comprising the step of:

(A) applying a negative voltage to said select-gate.

2. The method of claim 1 wherein said first portion of said channel region is adjacent said drain region, said method further comprising the steps of:

(B) applying a positive voltage to said drain region;

(C) applying a negative voltage to said control-gate;

(D) allowing the potential of said source region to float; and (E) applying a ground potential serving as a voltage reference to said substrate.

3. The method of claim 2 wherein said substrate is of P-type conductivity, and said source and drain regions are of N-type conductivity.

4. The method of claim 3 wherein said negative voltage in step (A) is approximately −5 volts, said positive voltage in step (B) is approximately 5 volts, and said negative voltage in step (C) is approximately −10 volts.

5. The method of claim 3 wherein said nonvolatile memory cell is a flash EEPROM.

* * * * *